(12) United States Patent
Chung et al.

(10) Patent No.: US 7,583,043 B2
(45) Date of Patent: Sep. 1, 2009

(54) APPARATUS, SYSTEM, AND METHOD FOR CONTROLLING SPEED OF A COOLING FAN

(75) Inventors: Chu Te Chung, Cary, NC (US); C. Charles Dishman, Raleigh, NC (US); Jen-Ching Lin, Apex, NC (US); Eino A. Lindfors, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/965,588

(22) Filed: Dec. 27, 2007

(65) Prior Publication Data

US 2009/0167228 A1    Jul. 2, 2009

(51) Int. Cl.
*G05D 23/275*    (2006.01)
(52) U.S. Cl. .................. 318/634; 318/729; 318/471; 388/803
(58) Field of Classification Search .............. 318/634, 318/783, 729, 471, 472, 473; 388/803, 934; 361/695, 687
See application file for complete search history.

(56) References Cited

U.S. PATENT DOCUMENTS

| | | | |
|---|---|---|---|
| 6,400,045 B1 | 6/2002 | Hosokawa et al. | 361/695 |
| 6,643,128 B2 | 11/2003 | Chu et al. | 361/687 |
| 6,654,894 B2 | 11/2003 | Kaminski et al. | 361/300 |
| 2006/0109627 A1 | 5/2006 | Lee | 361/695 |
| 2008/0313492 A1* | 12/2008 | Hansen | 714/5 |

* cited by examiner

*Primary Examiner*—Karen Masih
(74) *Attorney, Agent, or Firm*—Kunzler & McKenzie

(57) ABSTRACT

An apparatus, system, and method are disclosed for controlling fan speed. A power sensing module senses input voltage and current of a power supply. The power supply includes one or more stages and regulates at least one output bus. A power calculation module calculates input power from the input voltage and the input current. A temperature sensing module senses an ambient temperature and/or a temperature at a component cooled by a fan. A fan speed calculation module calculates a fan speed signal for the fan. The fan speed signal is a function of the input power calculated by the power calculation module and the sensed temperature sensed by the temperature sensing module for at least a portion of a fan speed range. A fan speed transmission module transmits the fan speed signal to the fan and adjusts a fan speed based on the fan speed signal.

20 Claims, 6 Drawing Sheets

APPARATUS, SYSTEM, AND METHOD FOR CONTROLLING SPEED OF A COOLING FAN

BACKGROUND OF THE INVENTION

1. Field of the Invention

This invention relates to fan control and more particularly relates to cooling fan control using input power and temperature.

2. Description of the Related Art

Electronic equipment, such as computers, servers, data storage devices, video game consoles, etc., often dissipate a lot power and generate a lot of heat while in operation. Often cooling fans are required to ensure normal equipment operation and to meet reliability goals. Fixed speed fans are sometimes used, however, fixed speed fans are not able to vary the speed of the fan and typically must be designed for worst-case operating conditions. Fixed speed fans are inefficient and undesirable because they run at full capacity at all times. Consequently, fixed speed fans produce more audible noise and diminish fan operating life.

Variable speed fans are commonly used in electronic devices and are capable of varying the speed of the fan. Some variable speed fans can vary fan speed continuously over a range. Other variable speed fans have discrete speeds and may be called multi-speed fans. Multi-speed fans are a step in the right direction toward quieter, more efficient electronic devices, but ultimately may not offer as much efficiency or noise reduction as may be desired. Variable speed fans where the speed is continuously variable over a range are the most flexible type of cooling fans and offer an ability to reduce power consumed by the fan at low speed and can significantly reduce noise of the electronic device that the fan is cooling.

Typically, variable speed fan control is tied to a temperature of a component. The component may be a power supply of an electronic device, a heat generating component in a power supply, a processor, a memory, a hard disk drive, a solid-state drive, etc. in system equipment, and the like. Temperature is typically measured at a desired point and the temperature is used in determining a fan speed. Fan control based on temperature alone, however, is not ideal because the fan speed control is reactive instead of proactive. In other words, adjusting fan speed based on temperature only adjusts the fan speed after the temperature has already increased. Once power dissipation is increased in a component, it takes time for the thermal information being transferred from the heat generating device to reach a temperature sensor. Required cooling sometimes may not be provided before the heat generating device gets too hot. In addition, other components may also be heating up and the heating may not be linear with the component where temperature is sensed.

SUMMARY OF THE INVENTION

From the foregoing discussion, it should be apparent that a need exists for an apparatus, system, and method that vary fan speed based on input power and temperature. Beneficially, such an apparatus, system, and method would more accurately adjust a fan speed based on total input power consumed by the equipment in addition to temperature.

The present invention has been developed in response to the present state of the art, and in particular, in response to the problems and needs in the art that have not yet been fully solved by currently available fan control methods. Accordingly, the present invention has been developed to provide an apparatus, system, and method for controlling a cooling fan using input power that overcome many or all of the above-discussed shortcomings in the art.

The apparatus to control speed of a cooling fan is provided with a plurality of modules configured to functionally execute the necessary steps of sensing input power of a power supply, sensing temperature, and generating a fan speed signal as a function of the input power and the sensed temperature. These modules in the described embodiments include a power sensing module that senses input voltage and input current of a stage of a power supply. The power supply includes one or more stages and the power supply is configured to regulate at least one output bus. The apparatus includes a power calculation module that calculates input power from the input voltage and the input current and a temperature sensing module that senses a temperature at a component, where the component is cooled by a fan.

The apparatus includes a fan speed calculation module that calculates a fan speed signal for the fan. The fan speed signal is a function of the input power calculated by the power calculation module and the sensed temperature for at least a portion of a fan speed range. The apparatus includes a fan speed transmission module that transmits the fan speed signal to the fan. The fan adjusts a fan speed based on the fan speed signal. In one embodiment, the fan speed signal for at least a portion of the fan speed range comprises the input power multiplied by a power constant added to the sensed temperature multiplied by a temperature constant.

In one embodiment, the fan speed signal includes a fan speed maximum signal corresponding to a fan speed maximum limit, where the fan speed signal is a function of the input power and the sensed temperature for at least a portion of the fan speed range below the fan speed maximum limit. In another embodiment, the fan speed maximum limit includes an absolute maximum fan speed independent of the sensed temperature and the input power, and/or a relative maximum fan speed that is a function of the sensed temperature. The relative maximum fan speed is lower than the absolute maximum fan speed. In another embodiment, the fan speed maximum limit includes at least the relative maximum fan speed and the fan speed signal is a function of the input power and sensed temperature when the input power is below an input power maximum level, and when the input power is above the input power maximum level, the fan speed signal is fixed such that the fan speed is equal to the relative maximum fan speed.

In one embodiment, the fan speed signal includes a fan speed minimum signal corresponding to a fan speed minimum limit, where the fan speed signal is a function of the input power and the sensed temperature for at least a portion of the fan speed range above the fan speed minimum limit. In another embodiment, the fan speed minimum limit includes an absolute minimum fan speed independent of the sensed temperature and the input power, and a relative minimum fan speed that is a function of the sensed temperature. The relative minimum fan speed is higher than the absolute minimum fan speed. In another embodiment, the fan speed minimum limit includes at least the relative minimum fan speed and the fan speed signal is a function of the input power and sensed temperature when the input power is above an input power minimum level and when the input power is below the input power maximum level, the fan speed signal is fixed such that the fan speed is equal to the relative minimum fan speed.

In one embodiment, the fan is a power supply fan, the sensed temperature is a power supply temperature, and the fan speed signal is a power supply fan speed signal calculated using the power supply temperature. In the embodiment, the temperature sensing module also senses a system temperature and the fan speed calculation module calculates a system fan speed signal. The system fan speed signal is a function of the input power and the sensed system temperature for at least a portion of a system fan speed range. In the embodiment, the fan speed transmission module also transmits the system fan speed signal to a system fan. The system fan adjusts a system fan speed based on the system fan speed signal.

In a further embodiment, the system fan selects from two or more system fan speed signals. Each system fan speed signal is received from a fan speed transmission module of a separate power supply, where a temperature sensing module of each power supply senses a common system temperature. In another embodiment, the system temperature is a temperature of a processor temperature, a hard drive temperature, a memory temperature, and/or an ambient computer temperature.

In one embodiment, sensing temperature at a component includes sensing temperature of one or more switching elements within the power supply, sensing an ambient temperature of the power supply, and/or sensing temperature of a power supply pulse-width modulator. In another embodiment, the sensing temperature at a component includes sensing a system temperature at a system component outside of the power supply and the fan is a system fan providing cooling to the system component. In another embodiment, the input voltage and the input current are measured at a location where power enters the power supply. In another embodiment, the input voltage and the input current are measured at a location within the power supply. A measured voltage and a measured current are a function at of the input voltage and input current respectively. The measured voltage and measured current are adjusted by one or more factors to represent the input power.

Another apparatus is included to control speed of a cooling fan. The apparatus includes a power sensing module that senses input voltage and input current of a stage of a power supply. The power supply includes one or more stages and the power supply is configured to regulate at least one output bus. The apparatus includes a power calculation module that calculates input power from the input voltage and the input current. The apparatus includes a temperature sensing module that senses a power supply temperature at a power supply component and senses a system temperature at a system component. The power supply temperature is sensed within the power supply. The system temperature is sensed within an electronic component serving as a load to the power supply.

The apparatus includes a fan speed calculation module that calculates a power supply fan speed signal for a power supply fan and calculates a system fan speed signal for a system cooling fan. The power supply fan speed signal is a function of the input power calculated by the power calculation module and the sensed power supply temperature for at least a portion of a power supply fan speed range of the power supply fan. The system fan speed signal is a function of the input power calculated by the power calculation module and the sensed system temperature for at least a portion of a system fan speed range of the system fan. The apparatus includes a fan speed transmission module that transmits the power supply fan speed signal to the power supply fan and transmits the system fan speed signal to the system fan. The power supply fan adjusts a power supply fan speed based on the power supply fan speed signal and the system fan adjusts a system fan speed based on the system fan speed signal.

A system of the present invention is also presented to control speed of a cooling fan. The system may be embodied by a power supply with one or more stages and configured to regulate at least one output bus, and a fan providing cooling for a component. In particular, the system, in one embodiment, includes a power sensing module that senses input voltage and input current of a stage of the power supply and a power calculation module that calculates input power from the input voltage and the input current. The system includes a temperature sensing module that senses a temperature at the component cooled by the fan. The system includes a fan speed calculation module that calculates a fan speed signal for the fan. The fan speed signal is a function of the input power calculated by the power calculation module and the sensed temperature for at least a portion of a fan speed range. The system includes a fan speed transmission module that transmits the fan speed signal to the fan, where the fan adjusts a fan speed based on the fan speed signal.

The system may further include an electronic device comprising a load for the power supply and connected to one or more output buses of the power supply. In one embodiment, the fan is a power supply fan, the sensed temperature is a power supply temperature, and the fan speed signal is a power supply fan speed signal calculated using the power supply temperature. The electronic device also includes a system fan. In the embodiment, the temperature sensing module also senses a system temperature within the electronic device and the fan speed calculation module calculates a system fan speed signal. The system fan speed signal is a function of the input power and the sensed system temperature for at least a portion of a system fan speed range. In the embodiment, the fan speed transmission module also transmits the system fan speed signal to the system fan, where the system fan adjusts a system fan speed based on the system fan speed signal.

In another embodiment, the electronic component is a blade in a blade center, a server, a personal computer, a laptop computer, a tablet computer, a router, a switch, a printer, an appliance, a portable electronic device, an electronic music device, a phone, or a personal digital assistant.

A method of the present invention is also presented for controlling speed of a cooling fan. The method in the disclosed embodiments substantially includes the steps necessary to carry out the functions presented above with respect to the operation of the at described apparatus and system. In one embodiment, the method includes sensing input voltage and input current of a stage of a power supply. The power supply includes one or more stages and the power supply is configured to regulate at least one output bus. The method includes calculating input power from the input voltage and the input current and sensing a temperature at a component, the component cooled by a fan. The method includes calculating a fan speed signal for the fan. The fan speed signal is a function of the input power calculated by the power calculation module and the sensed temperature for at least a portion of a fan speed range. The method includes transmitting the fan speed signal to the fan, where the fan adjusts a fan speed based on the fan speed signal.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1A:
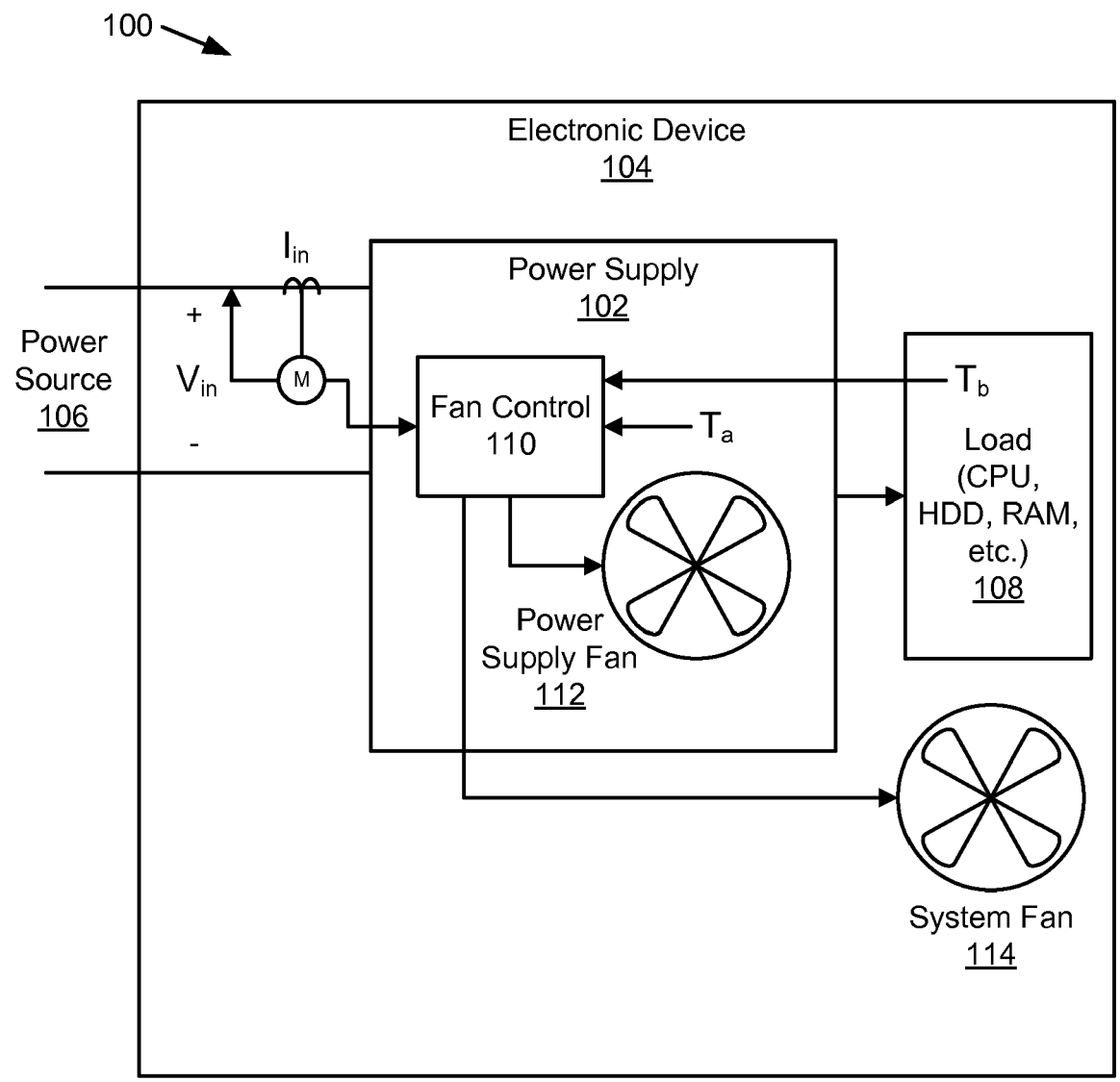
FIG. 1A is a schematic block diagram illustrating one embodiment of a system for controlling speed of a cooling fan in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1A is a schematic block diagram illustrating one embodiment of a system 100 for controlling speed of a cooling fan in accordance with the present invention. The system 100 includes a power supply 102 in an electronic device 104.

The power supply 102 is fed by a power source 106 and is connected to a load 108 of the electronic device 104. The power supply 102 includes a fan control 110 that controls a power supply fan 112 and a system fan 114. These components 102-114 of the system 100 are described below.

The system 100 includes a power supply 102. The power supply 102 converts electrical energy from one form to another to provide power to the load 108 of the electronic device 104. The power supply 102 receives power from a power source 106. The power source 106 may be an alternating current ("AC") source or a direct current ("DC") source. The power source 106 may be a wall outlet, a power bus, a building power source, another power supply, a battery, or the like. One of skill in the art will recognize other power sources 106.

The power supply 102 may include a single stage or may include multiple stages. For example, the power supply 102 may include one stage that receives power from the power source 106 and provides power to the load 108. The power supply 102 may include harmonic filtering elements. The power supply 102, in one embodiment, includes two or more power supply stages in parallel.

The power supply 102 may include, in one embodiment, a primary stage and a regulated stage. The primary stage, in one embodiment, includes an active power filter that corrects the power factor of the input power to near unity power factor. For example, the primary stage may be boost converter or similar topology which regulates a bus at the output of the primary stage to a voltage higher than the input current. The primary stage may also include harmonics filters. In another embodiment, the primary stage may include a rectifier to rectify AC current from the power source 106. In another embodiment, the primary stage includes two or more stages in parallel. In another embodiment, the primary stage includes passive components, such as filters, but does not include active components, such as switches. One of skill in the art will recognize other primary stages and topologies.

The power supply 102 may include a regulator stage. The regulator stage typically receives input power from an intermediate bus that is regulated by the primary stage. In another embodiment, where the primary stage is passive, the regulator stage receives unregulated power processed by the primary stage. In a preferred embodiment, the regulated stage controls an output bus connected to the load 108. The regulated stage may be a buck converter or other buck-derived topology. The regulated stage, in other embodiments, may be a boost converter, a buck-boost converter, a Cuk converter, etc. In another embodiment, the regulated stage may include multiple power supply stages in parallel that cooperate to provide power to the regulated bus. One of skill in the art will recognize other power supply topologies and combinations that provide power to the load 108.

The system 100 includes an electronic device 104 that supplies a load 108 to the power supply 102. The electronic device 104 may be a server, a personal computer, a laptop computer, a tablet computer, a router, a switch, a portable electronic device, a peripheral device, a personal digital assistant ("PDA"), a video game console, a music device, an appliance, etc. The electronic device 104 may be any device that uses a fan 112, 114 for cooling.

The load 108 is typically the components within the electronic device 104 that consume power. For example, the load 108 may be a central processing unit ("CPU"), an application specific integrated circuit ("ASIC"), a data storage device, such as a hard drive, optical drive, tape drive, etc., a memory, north bridge, a south bridge, a bus, or the like that consumes electrical power.

The system 100 includes a fan control 110. As depicted, the fan control 110 may be in the power supply 102. In another embodiment, the fan control 110 is external to the power supply 102. In another embodiment, the fan control 110 includes portions within the power supply 102 and outside the power supply 102. In accordance with the present invention, the fan control 110 receives temperature and power information, which is described in more detail below. The fan control 110 controls at least one fan 112, 114. In one embodiment, the fan control 110 controls two or more fans 112, 114.

The system 100 includes at least one fan 112, 114. In one embodiment, the system 100 includes a power supply fan 112 for cooling the power supply. In another embodiment, the system 100 includes a system fan 114 for cooling one or more components of the load 108 of the electronic device 104. In yet another embodiment, the system 100 includes a power supply fan 112 and a system fan 114. In another embodiment, the system 100 includes more than two fans. The fans 112, 114 may be AC or DC fans and may receive power directly from the fan control 110 or may receive power from an AC or DC source and may receive a fan control signal from the fan control 110.

Each fan 112, 114 may be a single fan or may be multiple fans controlled by a single signal. A multiple fan may include a primary fan and a backup fan. The fans 112, 114 are controlled by a fan speed signal. The power supply fan 112 is controlled by a power supply fan speed signal and the system fan 114 is controlled by a system fan speed signal. The fan speed signals may be digital or analog. In one embodiment where a fan speed signal is a digital signal, the fan 112, 114 may include a pulse-width modulator, processor, or electronics to convert the digital signal to a signal that controls speed of the fan 112, 114. In another embodiment the fan speed signal is an analog signal and the fan 112, 114 receiving the analog signal may directly use the signal to control fan 112, 114 speed or may modify the analog signal before using the modified signal to control fan 112, 114 speed.

In one embodiment, a fan 112, 114 may reach an absolute maximum fan speed. In one embodiment, the absolute maximum fan speed of the fan 112, 114 may be inherent in the fan 112, 114 or may be a fan speed signal set to avoid damage to the fan 112, 114. In another embodiment, the absolute maximum fan speed may be a limit of the fan speed signal range. For example, if a power supply voltage is a direct current ("DC") voltage of 12 volts ("V"), the fan speed signal may be limited to a value at or below 12 VDC. One of skill in the art will recognize other factors to limit a fan 112, 114 speed to an absolute maximum fan speed.

In another embodiment, a fan 112, 114 may have an absolute minimum fan speed. The absolute minimum fan speed, in one embodiment, is zero revolutions per minute. ("RPM"). In another embodiment, the absolute minimum fan speed may be a speed below which the fan 112, 114 may stall, cause excessive noise, be inefficient, etc. In another embodiment, the absolute minimum fan speed may correlate to a lower limit of the fan speed signal controlling the fan. One of skill in the art will recognize other factors to influence or create an absolute minimum fan speed.

In one embodiment, the power supply fan 112 is located in the power supply 102. In another embodiment, the power supply fan 112 is located next to or external to the power supply 102 and is positioned to provide cooling for the power supply 102. In another embodiment, the power supply fan 112 provides cooling to the power supply 102 via a duct, air passage, etc. One of skill in the art will recognize other ways that a power supply fan 112 can provide cooling for a power supply 102. In one embodiment, the power supply 102 is cooled by one fan 112. In another embodiment, the power supply 102 is cooled by two or more fans 112. Each fan 112 may be controlled by a single fan speed control signal or the multiple power supply fans 112 may be controlled by a single fan speed control signal.

In one embodiment, the system fan 114 is provided for cooling of a CPU, hard disk drive, memory, etc. of the load 108 of the electronic device 104. In another embodiment, the system fan 114 provides general cooling for the electronic device 104. In one embodiment, the system fan 114 is one fan. In another embodiment, the system fan 114 includes two or more fans controlled by a single fan speed signal. One of skill in the art will recognize that multiple system fans 114 may also be included that are each controlled by a different fan speed signal in accordance with the present invention.

Figure 1B:
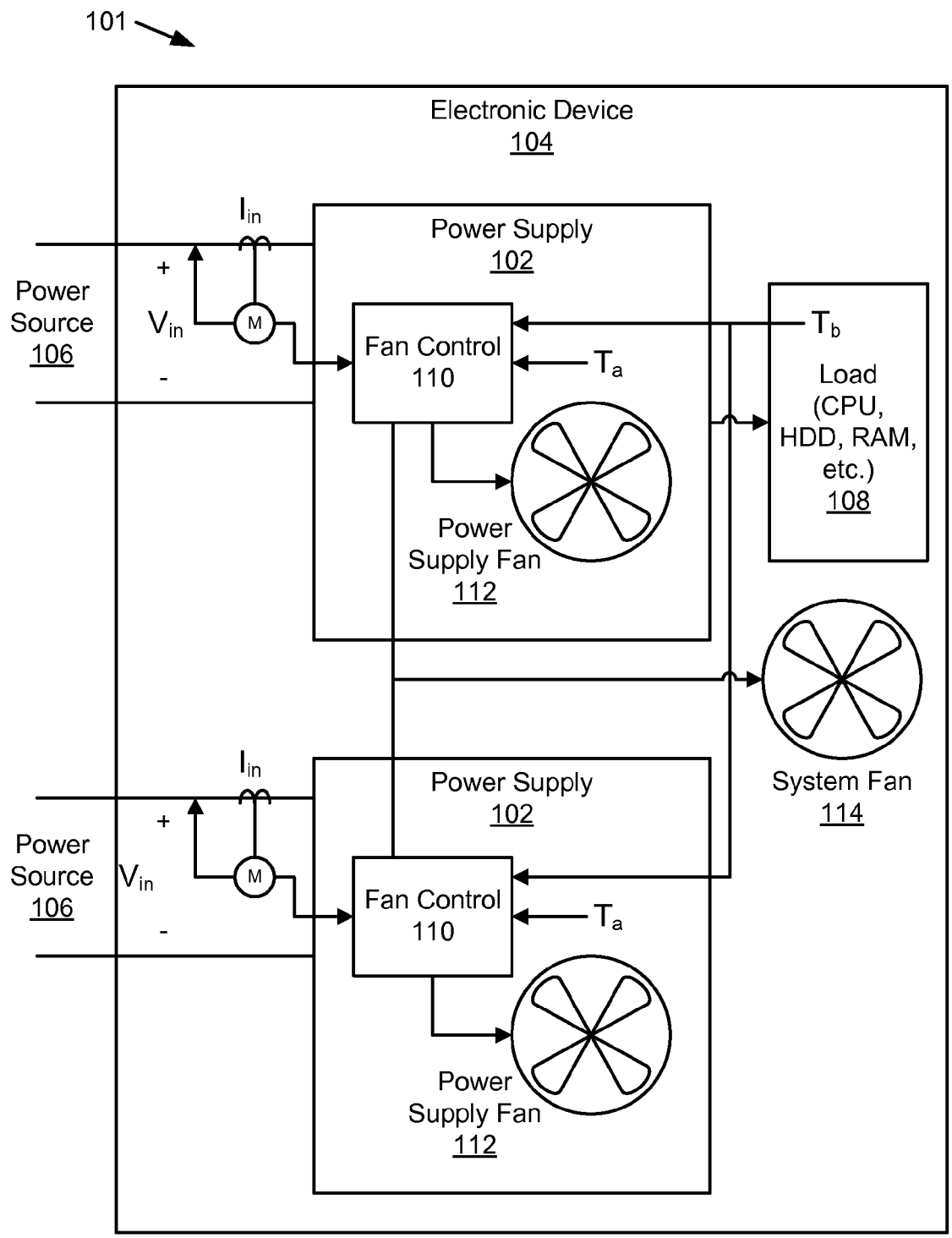
FIG. 1B is a schematic block diagram illustrating an alternate embodiment of a system for controlling speed of a cooling fan in accordance with the present invention.

FIG. 1B is a schematic block diagram illustrating an alternate embodiment of a system 101 for controlling speed of a cooling fan in accordance with the present invention. The system 101 includes an electronic device 104 with two power supplies 102 each fed by a power source 106 and connected to a load 108 of the electronic device 104. Each power supply 102 in the system 101 includes a fan control 110 that receives input current and input voltage signals and receives a power supply temperature Ta and a system temperature Tb. Each power supply 102 in the system 101 includes a power supply fan 112 controlled by a power supply fan speed signal from the fan control 110 of the power supply 102. The system 101 also includes a system fan 114. The power supplies 102, electronic device 104, power sources 106, load 108, fan control 110 and power supply fan 112 of each power supply 102, and the system fan 114 are substantially similar to those described above in relation to the system 100 of FIG. 1A.

The system 101 is indicative of a server, blade center, computer, etc. (represented by the electronic device 104) with redundant power supplies 102. One of skill in the art will recognize that the electronic device 104 may include more power supplies 102 than the two power supplies 102 depicted in FIG. 1A. The power supplies 102 supply the load 108 of the electronic device 104 with power through an output bus. In one embodiment, the power supplies 102 are connected in parallel and operate simultaneously to provide power to the load 108. In another embodiment, one or more power supplies 102 are in a standby mode and may provide power to the load 108 if a primary power supply 102 fails, loses power, or in some other way is unable to provide power to the load 108. In another embodiment, redundant output buses are included in the system 101 and the power supplies 102 are connected to one or more of the buses. In one embodiment, the system 101 includes two or more power sources 106 connected to one or more power supplies 102. In another embodiment, the system 101 includes one power source 106 connected to two or more power supplies 102. One of skill in the art will recognize other configurations of the system 101 to provide redundant power supplies 102.

Each fan control 110 of each power supply 102 in the system 101 receives a common system temperature Tb and uses the system temperature Tb to generate a system fan speed control signal. The system fan speed control signals from the fan controls 110 are all connected to the system fan 114 to provide a way to provide redundant control of the speed of the system fan 114. The system fan speed control signals from the fan controls 110 may be ORed together, connected to a signal bus, may be connected through some selection device, or other way known to those of skill in the art to provide redundant system fan speed signals to one or more system fans 114.

Figure 2:
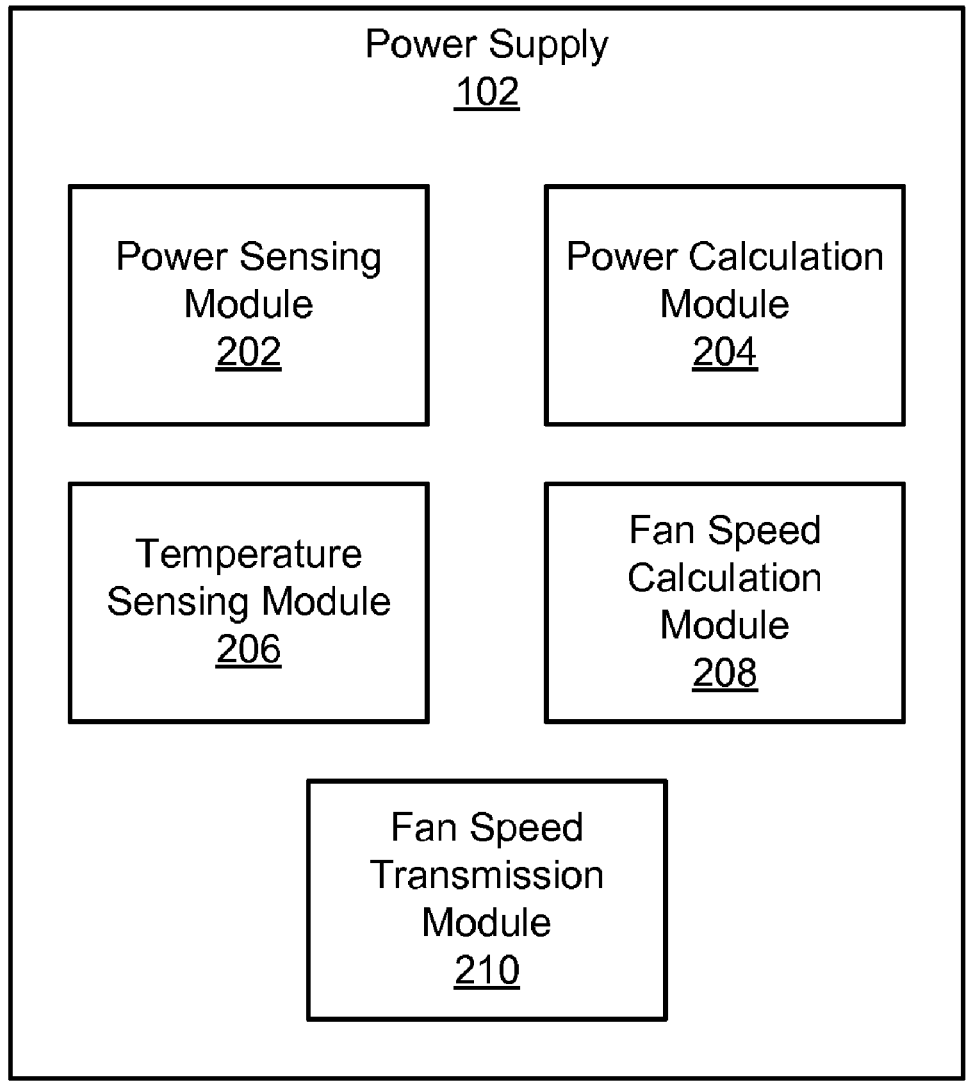
FIG. 2 is a schematic block diagram illustrating one embodiment of an apparatus for controlling speed of a cooling fan in accordance with the present invention.

FIG. 2 is a schematic block diagram illustrating one embodiment of an apparatus 200 for controlling speed of a cooling fan 112, 114 in accordance with the present invention. The apparatus 200 includes a power sensing module 202, a power calculation module 204, a temperature sensing module 206, a fan speed calculation module 208, and a fan speed transmission module 210, which are described below. All or a portion of each of the modules 202-210 of the apparatus 200 may be included in the power supply 102, in the fan control 110 of the power supply 102, external to the power supply 102, or some other location.

The apparatus 200 includes a power sensing module 202 that senses input voltage and input current of a stage of the power supply 102. In one embodiment, the power sensing module 202 senses the input voltage at or near input power terminals of the power supply 102. In another embodiment, the power sensing module 202 senses the input voltage or near at input power terminals of the electronic device 104. In another embodiment, the power sensing module 202 senses input voltage at a point internal to the power supply 102. For example, if input voltage is rectified and filtered, the power sensing module 202 may sense the input voltage after the filtering. In another embodiment, the power sensing module 202 may sense input voltage at another point internal to the power supply 102 where the sensed voltage is proportional to the input voltage or can be manipulated in some way to approximate the input voltage of the power supply 102. The sensed input voltage may be an alternating current ("AC") voltage or a DC voltage, or may be an AC voltage or other frequency-based time-varying signal and may include a DC offset.

In one embodiment, the input voltage is sensed by connecting to positive and negative input terminals. In another embodiment, the input voltage is sensed by connecting to each phase of a multi-phase power source 106 and to a ground if included. In one embodiment, input voltage is sensed using a voltage divider. In another embodiment, the input voltage is sensed using a transformer or a secondary winding on an inductor. One of skill in the art will recognize other ways to for the power sensing module 202 to sense input voltage.

In one embodiment, the power sensing module 202 senses input current at or near power input terminals of the power supply 102 or of the electronic device 104. In another embodiment, the power sensing module 202 senses input current within a stage of the power supply 102. The sensed input current may be sensed at a point were the input current is substantially equivalent to input current of the power supply 102. In another embodiment, current is sensed at a location in the power supply 102 and the sensed current is proportional to the input current of the power supply 102.

In one embodiment, the power sensing module 202 senses current with a current transformer. In another embodiment, the power sensing module 202 senses current through a component in the power supply 102, such as a resistor, switch, inductor, etc. The power sensing module 202 may sense current in one or more locations and may combine sensed current signals to arrive at a current that is proportional to input current of the power supply 102. One of skill in the art will recognize other ways to sense current that is the input current of the power supply 102 or is proportional to the input current of the power supply 102.

The power sensing module 202 may include sensing components, multipliers, and other conditioning circuitry to modify sensed voltage and current signals and to configure the sensed voltage and current to measure input power. Sensing and conditioning components may include resistors, capacitors, buffers, etc. In one embodiment, the sensed voltage and current signals are fed into a first processor. In another embodiment, opto-couplers may be used to translate a signal such as sensed current and/or voltage signals or a resulting processed signal to a secondary ground reference. In another embodiment, current and voltage sensing and processing includes analog components, such as resistors, inductors, capacitors, diodes, etc. One of skill in the art will recognize other ways for the power sensing module 202 to sense current and voltage that are equivalent to input voltage and current of the power supply 102 or are conditioned to be equivalent to the input voltage and current of the power supply 102.

The apparatus 200 includes a power calculation module 204 that calculates input power from the input voltage and the input current. The power calculation module 204 includes circuitry or processor code to multiply the input voltage and input current and any necessary factors to calculate input power. For example, if AC voltage is measured the power calculation module 204 may multiply the measured voltage by the square root of two to obtain a root-mean-square ("RMS") input voltage. Similarly, if AC current is measured, the measured current may be multiplied by the square root of two to get RMS input current. Other factors may also be used, such as the square root of three, which may be used if the power source 106 is three-phase. Other correction factors, scaling factors, etc. may also be used to calibrate the calculated input power to be substantially equivalent to input power of the power supply 102.

The apparatus 200 includes a temperature sensing module 206 that senses a temperature at a component that is cooled by a fan 112, 114. In one embodiment, the temperature sensing module 206 senses a single temperature. In another embodiment, the temperature sensing module 206 senses multiple temperatures. Where multiple temperatures are sensed, in one embodiment, the temperatures are each used to generate a fan speed signal.

In another embodiment, multiple temperatures are combined by averaging the temperatures or some other combining method to arrive at a temperature to be used to generate a fan speed control signal.

In one embodiment, power supply temperature Ta is sensed at a component within the power supply 102. For example, a power supply temperature Ta may be sensed at a die that includes switches of the power supply 102 or other critical component within the power supply 102. In another embodiment, power supply temperature Ta is measured at two or more components of the power supply 102. In another embodiment, the power supply 102 is a component and the power supply temperature Ta represents a general temperature of the power supply by sensing a circuit board temperature, a power supply case temperature, air temperature within the power supply 102, etc. One of skill in the art will recognize other ways to measure power supply temperature Ta to be used to generate a power supply fan speed signal.

In another embodiment, the temperature sensing module 206 senses system temperature Tb at a component within the electronic device 104, such as a CPU, hard disk drive, memory, motherboard, electronic device 104 case, etc. In another embodiment, the temperature sensing module 206 senses multiple system temperatures Tb at multiple components within the electronic device 104. In another embodiment, system temperature Tb is sensed at one or more points within the electronic device 104 and averaged, combined, or each used to generate multiple system fan speed signals. One of skill in the art will recognize other ways to sense one or more temperatures Ta, Tb in a power supply 102 and/or an electronic device 104.

The apparatus 200 includes a fan speed calculation module 208 that calculates a fan speed signal for the fan 112, 114. The fan speed signal is a function of the input power calculated by the power calculation module 204 and the sensed temperature Ta, Tb for at least a portion of a fan 112, 114 speed range. In one embodiment, the fan speed calculation module 208 calculates one fan speed signal. In another embodiment, the fan speed calculation module 208 calculates multiple fan speed signals for multiple fans 112, 114.

In one embodiment, the fan speed calculation module 208 calculates one or more power supply fan speed signal for one or more power supply fans 112, from one or more power supply temperatures Ta and the input power calculated by the power calculation module 204. Similarly, the fan speed calculation module 208 in various embodiments calculates one or more system fan speed signals for one or more system fans 114 from one or more system temperatures Tb. In yet another embodiment, the fan speed calculation module 208 calculates one or more power supply fan speed signals and one or more system fan speed signals. One of skill in the art will recognize other combinations of fan speed control signals that can be calculated by a fan speed calculation module 208.

In one embodiment for a given temperature Ta, Tb, the fan speed calculation module 208 calculates a fan speed signal that is a function of input power of the power supply 102. For example, for a given temperature Ta, Tb the fan speed calculation module 208 may include a formula such that for a low input power level the generated fan speed signal commands a fan 112, 114 to a low fan speed and for a high power level, the generated fan speed signal commands a fan 112, 114 to a high fan speed. In one embodiment, for a given sensed temperature Ta, Tb, the generated fan speed is linearly related to input power. This linear relationship between fan speed and input power is further discussed in relation to FIGS. 4A-4D. In other embodiments, the fan speed calculation module 208 calculates a fan speed signal that is non-linear, but is a function of temperature Ta, Tb and input power.

Generally, the fan speed calculation module 208 calculates a fan speed signal to control a fan 112, 114 such that as input power increases, fan speed of the fan 112, 114 will also increase. Similarly, the fan speed calculation module 208 calculates a fan speed signal such that as the temperature Ta, Tb increases, fan speed of the fan 112, 114 increases. Beneficially, by including input power into a fan speed calculation, fan speed can increase as power increases instead of waiting until temperature Ta, Tb increases. Thus, the fan 112, 114 speed control varies with input power, which is more indicative of heat generation and cooling need than temperature Ta, Tb alone. One of skill in the art will recognize other benefits of varying fan 112, 114 speed with input power as well as temperature Ta, Tb.

As mentioned above, a fan 112, 114 may have an absolute maximum fan speed and/or an absolute minimum fan speed. The maximum and minimum absolute fan speeds may be a function of the fan 112, 114 or artificially created to protect the fan, avoid excessive fan noise, etc. In addition, the fan speed calculation module 208 may include a relative maximum fan speed and a relative minimum fan speed. For example, for a given minimum input power level, the fan speed calculation module 208 may calculate a fixed minimum speed such that when input power dips below the minimum input power level, the fan speed signal calculated by the fan speed calculation module 208 will be fixed. When the input power is below the minimum input power level, the minimum fan speed may vary with temperature Ta, Tb or may be fixed.

The absolute minimum fan speed or a relative minimum fan speed may correspond to zero revolutions-per-minute at the fan 112, 114.

A relative minimum fan speed and/or an absolute minimum fan speed may be beneficial because power supplies 102 have a tendency to be inefficient at low power levels. Other components may also have a constant power loss at low power levels or may be inefficient at low power levels. For power supplies 102, reduced efficiency at low power levels occurs usually be cause switching losses remain constant so at low input power levels, the switching loses are still present in the power supply 102. Maintaining a minimum fan speed compensates for the low power inefficiency and allows for cooling even when input power is low.

In another embodiment, the fan speed calculation module 208 calculates a fan speed signal that is a function of input power and temperature Ta, Tb that is based on an efficiency curve of the component cooled by the fan 112, 114 controlled by the fan speed signal. This relationship may be linear or non-linear and may be table driven, calculated from a formula, etc.

In one embodiment, the fan speed calculation module 208 limits fan speed at an absolute maximum fan speed or at a relative maximum fan speed, where the relative maximum fan speed is at or below the absolute maximum fan speed. Where a relative maximum fan speed is calculated, a maximum input power level may be used to trigger the relative maximum fan speed. For example, for a given temperature Ta, Tb, if input power increases above the relative maximum input power level, the fan speed calculation module 208 may limit the calculated fan speed signal such that the fan speed of the controlled fan 112, 114 is constant. The relative maximum fan speed may increase with temperature Ta, Tb up to an absolute maximum fan speed. Relative and maximum fan speeds are described in more detail below in relation to FIGS. 4A-4D.

The apparatus 200 includes a fan speed transmission module 210 that transmits the fan speed signal calculated by the fan speed calculation module 208 to the fan 112, 114. The fan 112, 114 adjusts speed of the fan 112, 114 based on the fan speed signal. The fan speed transmission module 210 may transmit a digital signal or an analog signal. In one embodiment, the fan speed calculation module 208 and/or the fan speed transmission module 210 are included in a processor. In another embodiment, all or a portion of the fan speed calculation module 208 and/or the fan speed transmission module 210 are implemented with discrete components.

Figure 3:
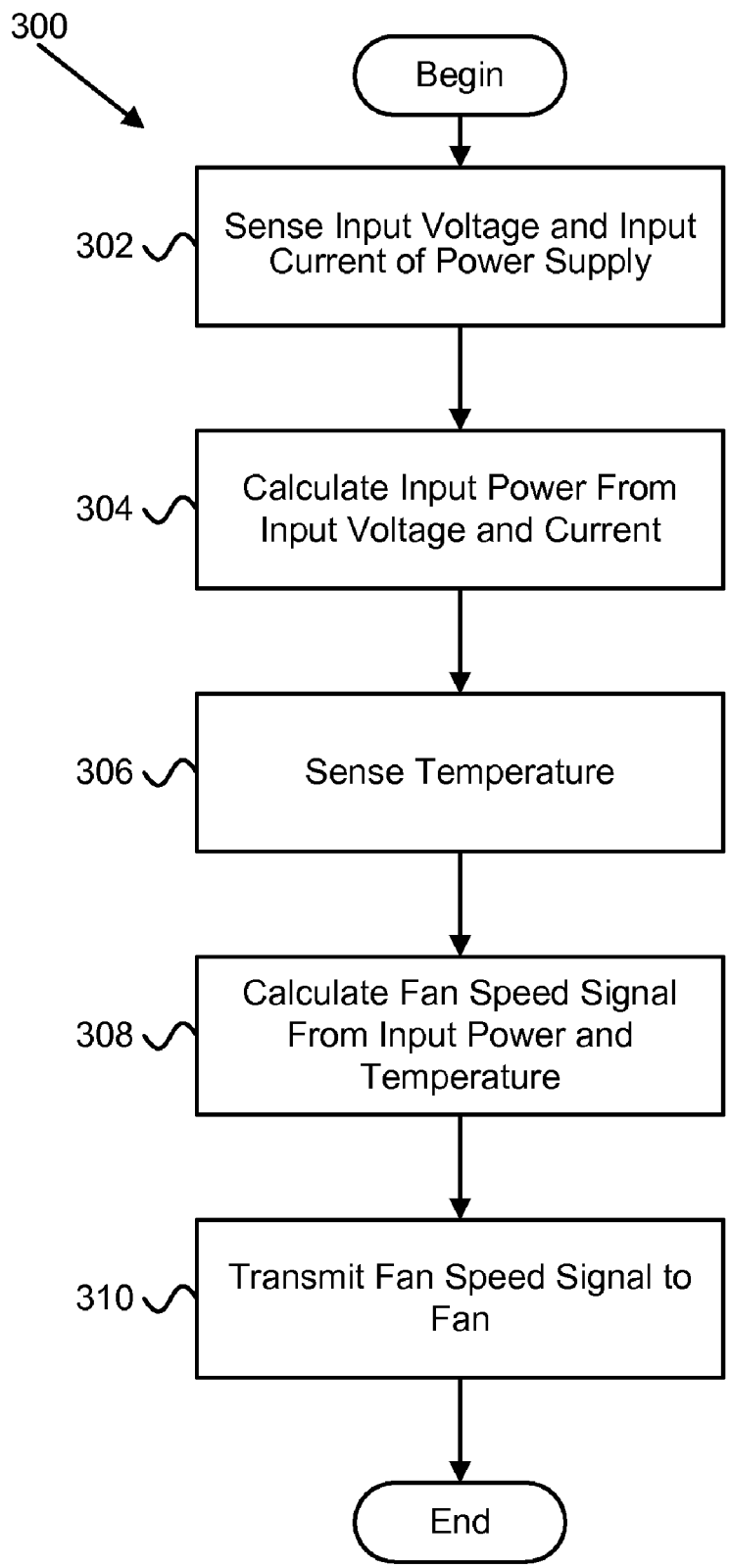
FIG. 3 is a schematic flow chart diagram illustrating one embodiment of a method for controlling speed of a cooling fan in accordance with the present invention.

FIG. 3 is a schematic flow chart diagram illustrating one embodiment of a method 300 for controlling speed of a cooling fan 112, 114 in accordance with the present invention. The method 300 begins and the power sensing module 202 senses 302 input voltage and input current of a stage of the power supply 102. Typically, the power sensing module 202 senses 302 input voltage and current at the first stage or primary stage of the power supply 102, but may also sense 302 voltage and current that are related to the input voltage and current of the stage.

The power calculation module 204 calculates 304 input power from the input voltage and the input current. The power calculation module 204 may multiply the sensed current and voltage and a constant to calculate input power of the stage of the power supply 102. The temperature sensing module 206 senses 306 a temperature Ta, Tb at a component cooled by a fan 112, 114. The component may be the power supply 102, a component within the power supply 102, the electronic device 104, or a component within the electronic device 104.

The fan speed calculation module 208 calculates 308 a fan speed signal for the fan 112, 114 where the fan speed signal is a function of both the input power calculated by the power calculation module 204 and the sensed temperature Ta, Tb sensed by the temperature sensing module 206 for at least a portion of a fan 112, 114 speed range. The fan speed signal may be linear or non-linear with respect to the input power and sensed temperature Ta, Tb, the fan speed signal may include maximum and/or minimum speed limits. The fan speed transmission module 210 transmits 310 the fan speed signal to the fan 112, 114 and the method 300 ends. The fan 112 adjusts fan speed based on the fan speed signal.

Figure 4A:
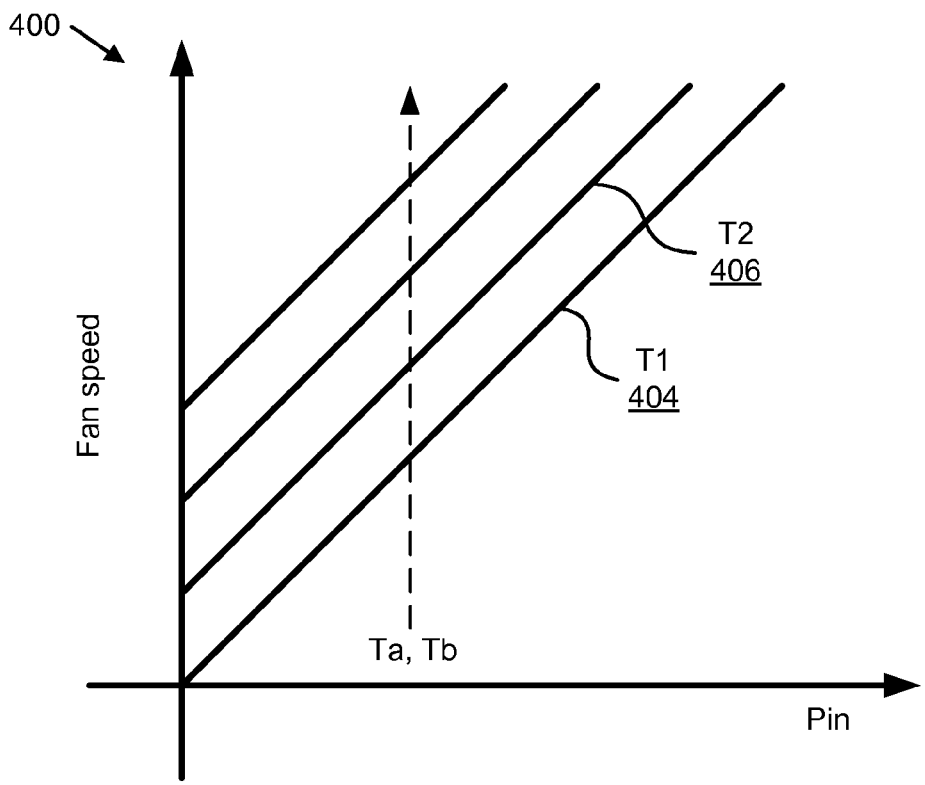
FIG. 4A is graph illustrating one method for controlling speed of a cooling fan in accordance with the present invention.

FIG. 4A is graph illustrating one method 400 for controlling speed of a cooling fan 112, 114 in accordance with the present invention. The method 400 depicts a linear relationship between input power of a power supply 102 stage and fan speed. For this method 400, for a given temperature, fan speed increases linearly with respect to input power Pin. For example when the sensed temperature Ta, Tb is at temperature T1 404, when input power is zero, fan speed is zero. As input power increases, fan speed increases linearly. When the sensed temperature Ta, Tb increases to temperature T2 406, the fan speed shifts up so when input power is zero, fan speed is at a value greater than zero. While the method 400 depicts a linear relationship between input power and fan speed, the relationship could be non-linear. In addition, the fan speed curves depicted are a few discrete points illustrated for simplicity, but fan speed can vary continuously with input power and sensed temperature Ta, Tb.

Figure 4B:
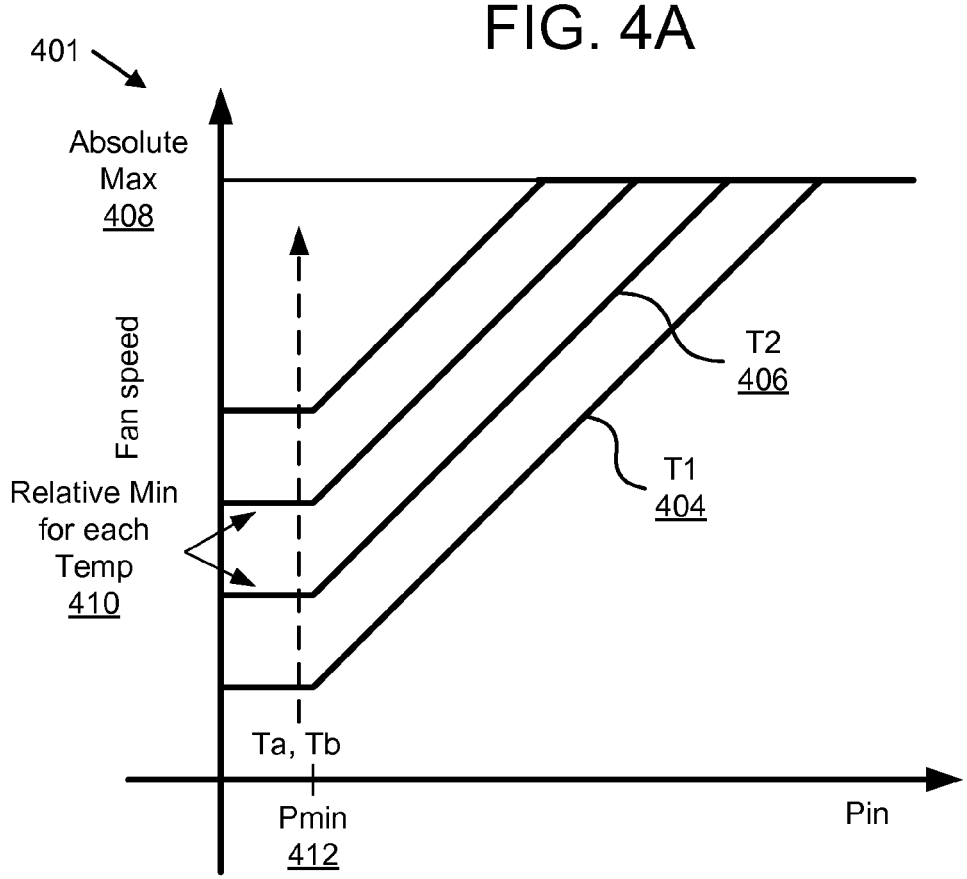
FIG. 4B is graph illustrating another method for controlling speed of a cooling fan with a maximum fan speed in accordance with the present invention.

FIG. 4B is graph illustrating another method 401 for controlling speed of a cooling fan 112, 114 with a maximum fan speed in accordance with the present invention. The method 401 is similar to the method 400 of FIG. 4A, but includes an absolute maximum fan speed 408 and a relative minimum fan speed 410 that varies for each temperature Ta, Tb. The relative fan speed minimum 410 is triggered at a minimum input power level 412. For example, when the sensed temperature Ta, Tb is at temperature T1 404 and input power is below the minimum input power level 412, the fan speed is constant at a relative minimum fan speed 410. When input power is above the minimum input power level 412, fan speed increases as a function of input power. Here fan speed increases linearly, but may also increase non-linearly. When the fan speed reaches the absolute maximum fan speed 408, the fan speed remains constant as input power continues to increase.

When the sensed temperature Ta, Tb increases to temperature T2 406, at power levels below the minimum input power level 412 the fan speed remains constant at a relative minimum fan speed 410, but is higher than for temperature T1 404. Again as input power increases above the minimum input power level 412, the fan speed increases until the fan speed matches the absolute fan speed maximum 408 and remains at the absolute fan speed maximum 408 as input power increases.

Figure 4C:
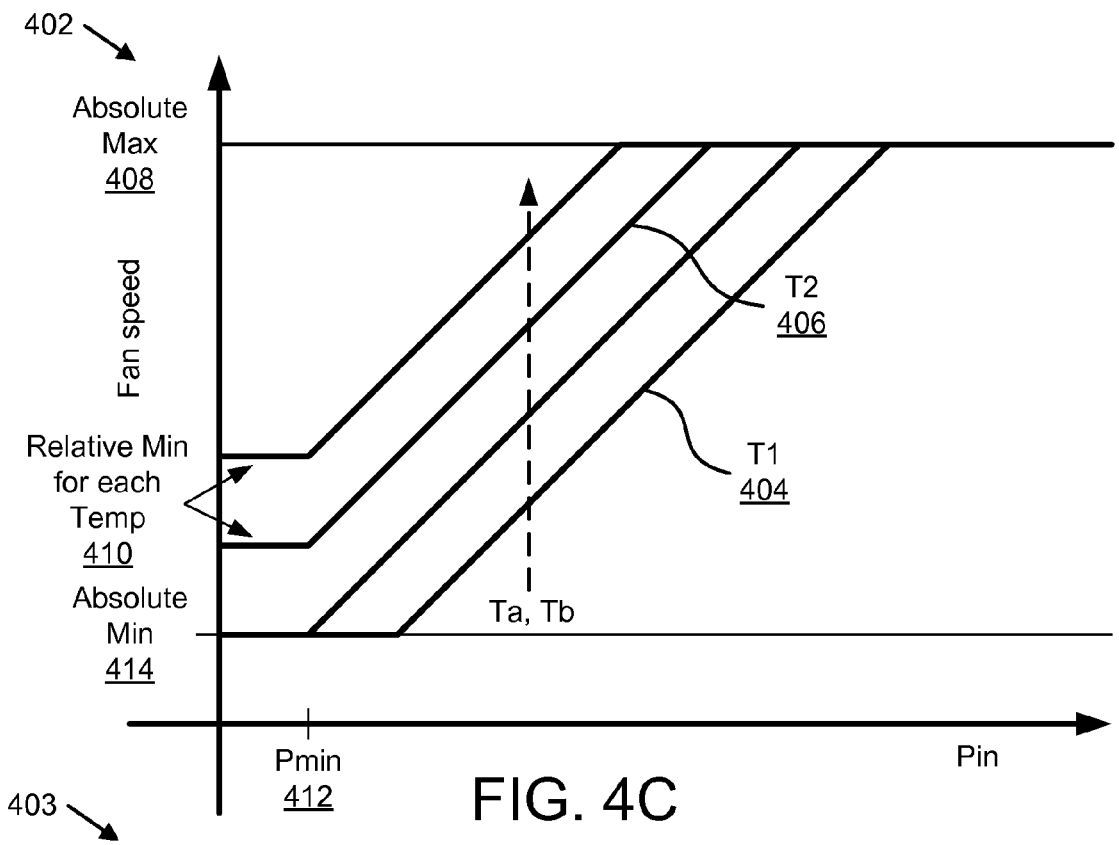
FIG. 4C is graph illustrating another method for controlling speed of a cooling fan with an absolute maximum fan speed and absolute and relative minimum fan speed in accordance with the present invention.

FIG. 4C is graph illustrating another method 402 for controlling speed of a cooling fan 112, 114 with an absolute maximum fan speed and absolute and relative minimum fan speed in accordance with the present invention. The method 402 is similar to the method 401 depicted in FIG. 4B except that an absolute minimum fan speed 414 is included. When the sensed temperature Ta, Tb is at temperature T2 406, for input power below the minimum input power level 412 the fan speed is fixed at a relative minimum fan speed 410. As input power rises above the minimum input power level 412, the fan speed increases until it reaches the absolute maximum fan speed 408. When the sensed temperature Ta, Tb decreases to temperature T1 404, the minimum fan speed is limited by the absolute minimum fan speed 414 instead of a relative minimum fan speed 410.

Figure 4D:
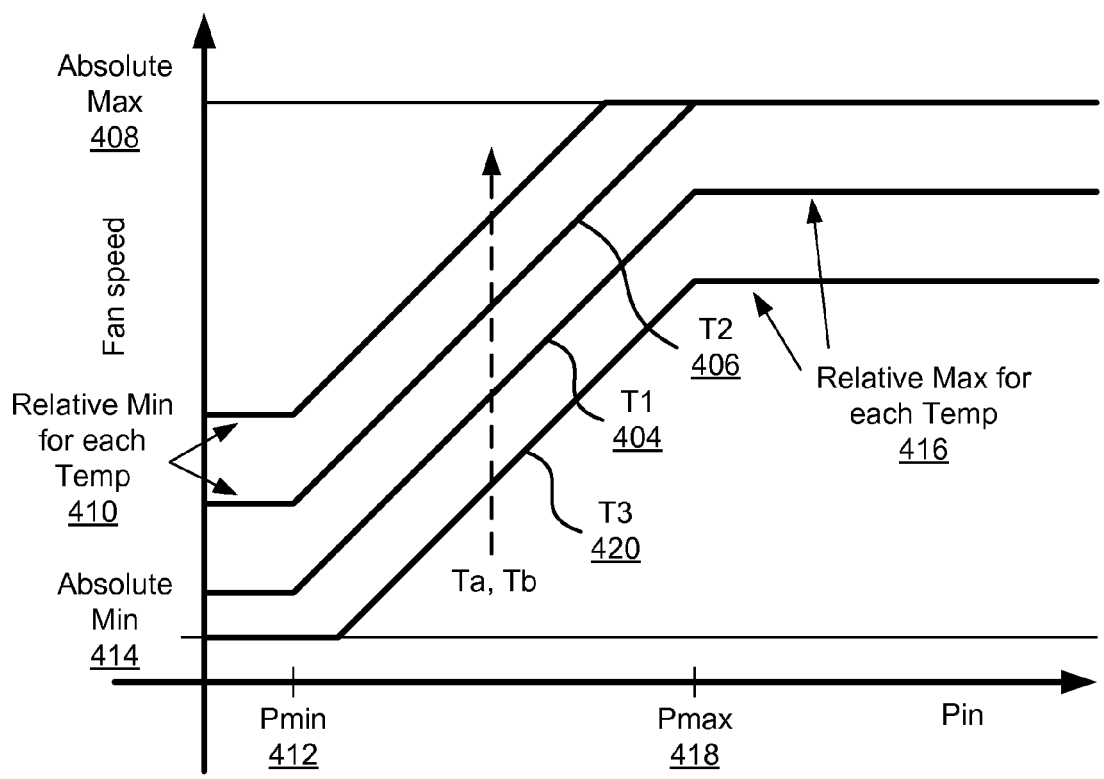
FIG. 4D is graph illustrating another method for controlling speed of a cooling fan with an absolute and relative maximum fan speed and an absolute and relative minimum fan speed in accordance with the present invention.

FIG. 4D is graph illustrating another method 403 for controlling speed of a cooling fan 112, 114 with an absolute and relative maximum fan speed and an absolute and relative minimum fan speed in accordance with the present invention. The method 403 is similar to the method 402 of FIG. 4C except that a relative maximum fan speed 416 is included. For example, when the sensed temperature Ta, Tb is at temperature T1 404 and input power is below the minimum power level 412, the fan speed is constant at a relative minimum fan speed 410. As input power of the power supply 102 increases above the minimum input power level 412, the fan speed increases as a function of input power until input power reaches a maximum input power level 418. As input power increases above the maximum input power level 418, fan speed remains constant at a relative maximum fan speed 416. When the sensed temperature Ta, Tb increases to temperature T2, the fan speed is limited by the absolute maximum fan speed 408 instead of a relative maximum fan speed 416. When the sensed temperature Ta, Tb decreases, for example to temperature T3 420, the minimum fan speed is limited by the absolute minimum fan speed 414 instead of the relative minimum fan speed 410.

Beneficially, controlling fan speed using input power and temperature allows more flexibility in fan control and provides cooling at a level that more closely matches heating within a power supply 102 or electronic device 104. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to control speed of a cooling fan, the apparatus comprising:
    a power sensing module that senses input voltage and input current of a stage of a power supply, the power supply comprising one or more stages, the power supply configured to regulate at least one output bus;
    a power calculation module that calculates input power from the input voltage and the input current;
    a temperature sensing module that senses a temperature at a component, the component cooled by a fan;
    a fan speed calculation module that calculates a fan speed signal for the fan, the fan speed signal being a function of the input power calculated by the power calculation module and the sensed temperature for at least a portion of a fan speed range; and
    a fan speed transmission module that transmits the fan speed signal to the fan, the fan adjusting a fan speed based on the fan speed signal.

2. The apparatus of claim 1, wherein the fan speed signal for at least a portion of the fan speed range comprises the input power multiplied by a power constant added to the sensed temperature multiplied by a temperature constant.

3. The apparatus of claim 1, wherein the fan speed signal comprises a fan speed maximum signal corresponding to a fan speed maximum limit, wherein the fan speed signal is a function of the input power and the sensed temperature for at least a portion of the fan speed range below the fan speed maximum limit.

4. The apparatus of claim 3, wherein the fan speed maximum limit comprises one or more of an absolute maximum fan speed independent of the sensed temperature and the input power, and a relative maximum fan speed that is a function of the sensed temperature, the relative maximum fan speed being lower than the absolute maximum fan speed.

5. The apparatus of claim 4, wherein the fan speed maximum limit comprises at least the relative maximum fan speed and wherein the fan speed signal is a function of the input power and sensed temperature when the input power is below an input power maximum level and when the input power is above the input power maximum level, the fan speed signal is fixed such that the fan speed is equal to the relative maximum fan speed.

6. The apparatus of claim 1, wherein the fan speed signal comprises a fan speed minimum signal corresponding to a fan speed minimum limit, wherein the fan speed signal is a function of the input power and the sensed temperature for at least a portion of the fan speed range above the fan speed minimum limit.

7. The apparatus of claim 6, wherein the fan speed minimum limit comprises one or more of an absolute minimum fan speed independent of the sensed temperature and the input power, and a relative minimum fan speed that is a function of the sensed temperature, the relative minimum fan speed being higher than the absolute minimum fan speed.

8. The apparatus of claim 7, wherein the fan speed minimum limit comprises at least the relative minimum fan speed and wherein the fan speed signal is a function of the input power and sensed temperature when the input power is above an input power minimum level and when the input power is below the input power maximum level, the fan speed signal is fixed such that the fan speed is equal to the relative minimum fan speed.

9. The apparatus of claim 1, wherein the fan comprises a power supply fan, the sensed temperature comprises a power supply temperature and the fan speed signal comprises a power supply fan speed signal calculated using the power supply temperature, and wherein
    the temperature sensing module further comprises sensing a system temperature;
    the fan speed calculation module calculates a system fan speed signal, the system fan speed signal being a function of the input power and the sensed system temperature for at least a portion of a system fan speed range; and
    the fan speed transmission module further transmits the system fan speed signal to a system fan, the system fan adjusting a system fan speed based on the system fan speed signal.

10. The apparatus of claim 9, wherein the system fan selects from two or more system fan speed signals, each system fan speed signal being received from a fan speed transmission module of a separate power supply, wherein a temperature sensing module of each power supply senses a common system temperature.

11. The apparatus of claim 9, wherein the system temperature comprises a temperature of one or more of a processor temperature, a hard drive temperature, a memory temperature, and an ambient computer temperature.

12. The apparatus of claim 1, wherein sensing temperature at a component comprises one or more of sensing temperature of one or more switching elements within the power supply, sensing an ambient temperature of the power supply, and sensing temperature of a power supply pulse-width modulator.

13. The apparatus of claim 1, wherein the sensing temperature at a component comprises sensing a system temperature at a system component outside of the power supply and the fan comprises a system fan providing cooling to the system component.

14. The apparatus of claim 1, wherein the input voltage and the input current are measured at one of:
   a location where power enters the power supply; and
   a location within the power supply, wherein a measured voltage and a measured current are a function of the input voltage and input current respectively, and wherein the measured voltage and measured current are adjusted by one or more factors to represent the input power.

15. An apparatus to control speed of a cooling fan, the apparatus comprising:
   a power sensing module that senses input voltage and input current of a stage of a power supply, the power supply comprising one or more stages, the power supply configured to regulate at least one output bus;
   a power calculation module that calculates input power from the input voltage and the input current;
   a temperature sensing module that senses a power supply temperature at a power supply component and senses a system temperature at a system component, the power supply temperature sensed within the power supply, the system temperature sensed within an electronic component serving as a load to the power supply;
   a fan speed calculation module that calculates a power supply fan speed signal for a power supply fan and calculates a system fan speed signal for a system cooling fan, the power supply fan speed signal being a function of the input power calculated by the power calculation module and the sensed power supply temperature for at least a portion of a power supply fan speed range of the power supply fan, the system fan speed signal being a function of the input power calculated by the power calculation module and the sensed system temperature for at least a portion of a system fan speed range of the system fan; and
   a fan speed transmission module that transmits the power supply fan speed signal to the power supply fan and transmits the system fan speed signal to the system fan, the power supply fan adjusting a power supply fan speed based on the power supply fan speed signal, the system fan adjusting a system fan speed based on the system fan speed signal.

16. A system to control speed of a cooling fan, the system comprising:
   a power supply, the power supply comprising one or more stages, the power supply configured to regulate at least one output bus;
   a fan providing cooling for a component;
   a power sensing module that senses input voltage and input current of a stage of the power supply;
   a power calculation module that calculates input power from the input voltage and the input current;
   a temperature sensing module that senses a temperature at the component, the component cooled by the fan;
   a fan speed calculation module that calculates a fan speed signal for the fan, the fan speed signal being a function of the input power calculated by the power calculation module and the sensed temperature for at least a portion of a fan speed range; and
   a fan speed transmission module that transmits the fan speed signal to the fan, the fan adjusting a fan speed based on the fan speed signal.

17. The system of claim 16, further comprising an electronic device comprising a load for the power supply and connected to one or more output buses of the power supply.

18. The system of claim 17, wherein the fan comprises a power supply fan, the sensed temperature comprises a power supply temperature, and the fan speed signal comprises a power supply fan speed signal calculated using the power supply temperature, the electronic device further comprising a system fan, and wherein
   the temperature sensing module further comprises sensing a system temperature within the electronic device;
   the fan speed calculation module calculates a system fan speed signal, the system fan speed signal being a function of the input power and the sensed system temperature for at least a portion of a system fan speed range; and
   the fan speed transmission module further transmits the system fan speed signal to the system fan, the system fan adjusting a system fan speed based on the system fan speed signal.

19. The system of claim 17, wherein the electronic component comprises one of a blade in a blade center, a server, a personal computer, a laptop computer, a tablet computer, a router, a switch, a printer, an appliance, a portable electronic device, an electronic music device, a phone, and a personal digital assistant.

20. A computer program product comprising a computer readable medium having computer usable program code executable to perform operations for controlling speed of a cooling fan, the operations of the computer program product comprising:
   sensing input voltage and input current of a stage of a power supply, the power supply comprising one or more stages, the power supply configured to regulate at least one output bus;
   calculating input power from the input voltage and the input current;
   sensing a temperature at a component, the component cooled by a fan;
   calculating a fan speed signal for the fan, the fan speed signal being a function of the input power calculated by the power calculation module and the sensed temperature for at least a portion of a fan speed range; and
   transmitting the fan speed signal to the fan, the fan adjusting a fan speed based on the fan speed signal.

* * * * *